United States Patent [19]

Riddle

[11] 4,024,457
[45] May 17, 1977

[54] HARD-FIRING ZERO-CROSSING TRIGGER CONTROL CIRCUIT

[76] Inventor: Grant C. Riddle, 29 Harvard, Sunnyvale, Calif. 94087

[22] Filed: Nov. 4, 1975

[21] Appl. No.: 628,775

[52] U.S. Cl. .......................... 323/35; 307/252 UA; 323/21; 323/24; 323/38; 361/6
[51] Int. Cl.² .................. G05F 5/00; H03K 17/60
[58] Field of Search ............ 323/21, 22 SC, 24, 34, 323/38, 39, 9, 34–36; 328/2; 307/311, 252 UA, 296, 133, 310, 266

[56] References Cited

UNITED STATES PATENTS

| | | | |
|---|---|---|---|
| 3,335,360 | 8/1967 | Reinert | 323/22 SC |
| 3,506,852 | 4/1970 | De Hart | 307/252 UA |
| 3,577,177 | 5/1971 | Hewlett, Jr. | 323/24 |
| 3,848,140 | 11/1974 | Guermeur et al. | 307/252 UA |
| 3,917,962 | 11/1975 | Pascente | 307/311 |

Primary Examiner—Gerald Goldberg
Attorney, Agent, or Firm—John J. Leavitt

[57] ABSTRACT

Presented is an electronic circuit composed of various cooperating semiconductor-type devices controlling the degree and timing of triggering of a power switching device to effect controlled electrical conduction through the device. The circuit achieves a "zero-voltage-switch" (ZVS) function where the triggering of the power switching device can occur only during an interval when the main power terminal voltage is less than a predetermined value. The circuit comprises a high-voltage current limiting resistor comprised of a depletion MOSFET or JFET device used as a current limited source to drive other transistor amplifiers and switching circuits, the means of diverting this limited current through application of an external control signal separate from the power terminals, and a means of providing a limited source voltage to the external control means for use if required.

25 Claims, 20 Drawing Figures

HARD-FIRING ZERO-CROSSING TRIGGER CONTROL CIRCUIT

BACKGROUND OF THE INVENTION

This invention relates to an electronic circuit assembled of various electrical and semiconductor components to provide automatically controlled switching of a two-terminal trigger device. The general use of such a trigger device is for exact triggering of larger, higher-current rated semiconductor switching components such as the triac or thyristor. Several circuits of this nature are used in zero-voltageswitching (ZVS) triggers in AC power solid state relays (SSR), however this circuit is not intended to be limited to only SSR type application, since other uses will become apparent to those having alternative applications.

Another function of the circuit is to cause limiting of the maximum value of current to be conducted between the two main power terminals. Other variations and possible modifications perform similar switching action. All switching action is controlled by an externally supplied current. This circuit possesses a minimum leakage current between the power terminals when the device is not triggered.

In this invention, an electronic circuit comprised of various semiconductor type devices controls the degree and timing of triggering of a power switching device such as to effect controlled electrical conduction through the device. The circuit also prevents accidental switching or "triggering" of the power switching device from random noise or interference voltage on the main power terminals. Several variations of the basic circuit concept are possible in different complexities and functions.

One object of the invention is to achieve a "zerovoltage-switch" (ZVS) function whereby the triggering of the power switching device is restricted to occur only during the interval that the voltage on the main power terminal is less than a predetermined value.

Another object of the invention is to provide a control circuit capable of limiting the maximum value of peak current to be conducted between two main power terminals to provide protection for itself and the power switching device from excessive current.

Still another object of the invention is to provide a trigger control circuit requiring no external source of power other than that available at the two power switching terminals connected to the power triac or thyristor device, and requiring no external components for its function.

A further object of the invention is to improve the thermal stability of the normal type of thyristor or triac switching device by employing a clamped-gate function prior to triggering or, in the case of non-triggering, to employ a clamped-gate function to prevent false triggering after the terminal voltage has exceeded the trigger limit point.

A still further object of the invention is to employ a high-voltage current-limited resistor constructed in the form of a depletion mode MOSFET or JFET as a non-linear resistor to provide the power drive to the switching and control circuits so as to cause a minimum of leakage current during periods of high terminal voltage when non-triggered, yet so as to deliver adequate current and voltage to the switching and control circuits to achieve adequate functions.

Yet another object of the invention is to provide a predetermined minimum requirement of the input control signal level to permit control from relatively low current sensors.

Another object of the invention is to provide means for prevention of false triggering of the switching device from rapid changes of terminal voltage (dV/dt) and also from excessive voltage (overvoltage) applied to the circuit as a transient or sustained condition.

A still further object of the invention is to provide a circuit which will produce a definite voltage transient and sudden current initiation at the instant of switching so as to deliver a positive drive signal to the subsequently triggered device.

Another object of the invention is to provide a circuit having the capability of instant triggering where required in a time of less than one microsecond so as to respond to unusual power factor relationships in the externally triggered circuit.

A still further object of the invention is to provide an adequately functional control circuit requiring a minimum number of high voltage components.

The invention possesses other objects and advantages, some of which, with the foregoing, will be apparent from the following description and the drawings. It is to be understood however that the invention is not limited to the embodiments illustrated and described since it may be embodied in various forms within the scope of the appended claims.

SUMMARY OF THE INVENTION

In terms of broad inclusion, the trigger control circuit of the invention comprises a cooperative combination of several separate circuit means to effect sudden voltage and current drive to a power switching device to cause the power switching device to suddenly turn "on" and latch into a conductive state. Included in the cooperative combination of circuits are means for providing a current limited voltage source which functions as a voltage limit threshold sensor. Means are also provided constituting a controlled voltage source to function as a power supply to a low voltage switching control circuit. Means are also provided constituting the low-voltage switching control circuit, and for providing a high voltage current booster which functions as a driver to a high voltage regenerative power switch. Functional stability of the circuit is enhanced by providing means for clamping voltages and shunting unwanted thermal leakage currents. Means are also provided enabling the regenerative power switching portion of the circuit to function as a high voltage latching current switch to effect sudden current pulses, and for limiting the amplitude of said current pulses.

DESCRIPTION OF THE PREFERRED EMBODIMENT

The present invention relates to a trigger control circuit for generating a voltage/current pulse upon the presence of an input control signal to be supplied from an external source. The control circuit includes a plurality of semiconductor transistor devices to effect the switching and auxiliary functions. In the ZVS version, an internal circuit serves to inhibit the triggering when the terminal voltage exceeds a predetermined maximum. Upon triggering a definite current pulse is delivered to a subsequent power switching device.

Figure 1:
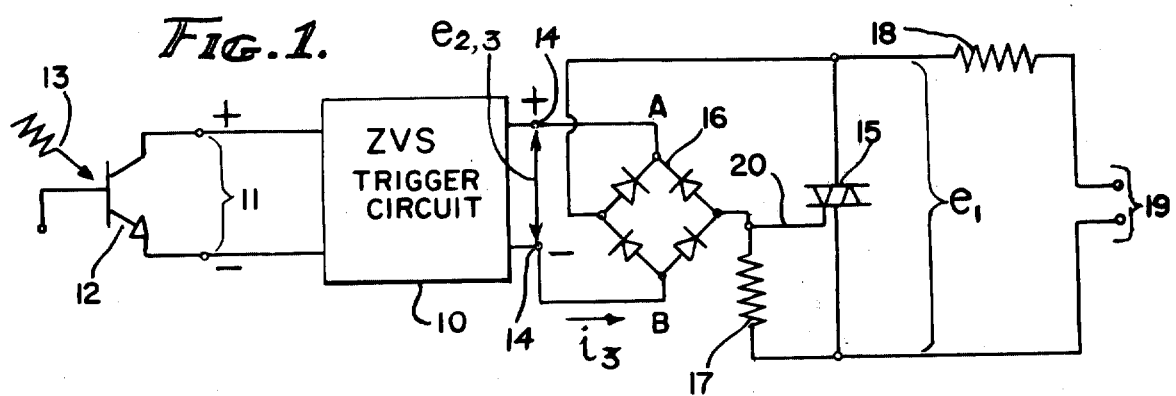
FIG. 1 illustrates the manner of use of the circuit forming the subject matter of the invention.

The general application of such a trigger control circuit is illustrated in the circuit of FIG. 1 where the zero-voltage-switch (ZVS) trigger circuit is designated by the reference 10, with the two input control terminals 11 shown connected to a current-control device such as the phototransistor 12, or in substitution for the phototransistor 12, a variable resistor 13. The variable resistor 13 can be of any type including a potentiometer, photoresistor, or a series switch resistor combination. The power switching terminal 14 having the specific polarities indicated are connected to the power switching device 15, here shown as a triac device, through a rectifier bridge 16 of four diodes with a bleeder resistor 17 connected to by-pass any minor leakage current. The power switch is in series with the load resistor 18 and line terminals 19, while the (ZVS) 10 is in parallel with the triac 15. At a time when the triac 15 is OFF, any voltage across the triac 15 is delivered to the switching terminal 14 of the (ZVS) 10. When the input control device 12 conducts sufficient current, the (ZVS) 10 will conduct a large current, which current is conducted through the gate terminal 20 of the triac 15, causing the triac to trigger ON, thus conducting heavy current through the load resistor 18. The ZVS 10 must re-trigger the triac 15 for each one-half cycle of the power line at 19, reserving the triggering for only a period of time that the voltage across the triac 15 is low, typically not to exceed 5 volts.

Figure 3:
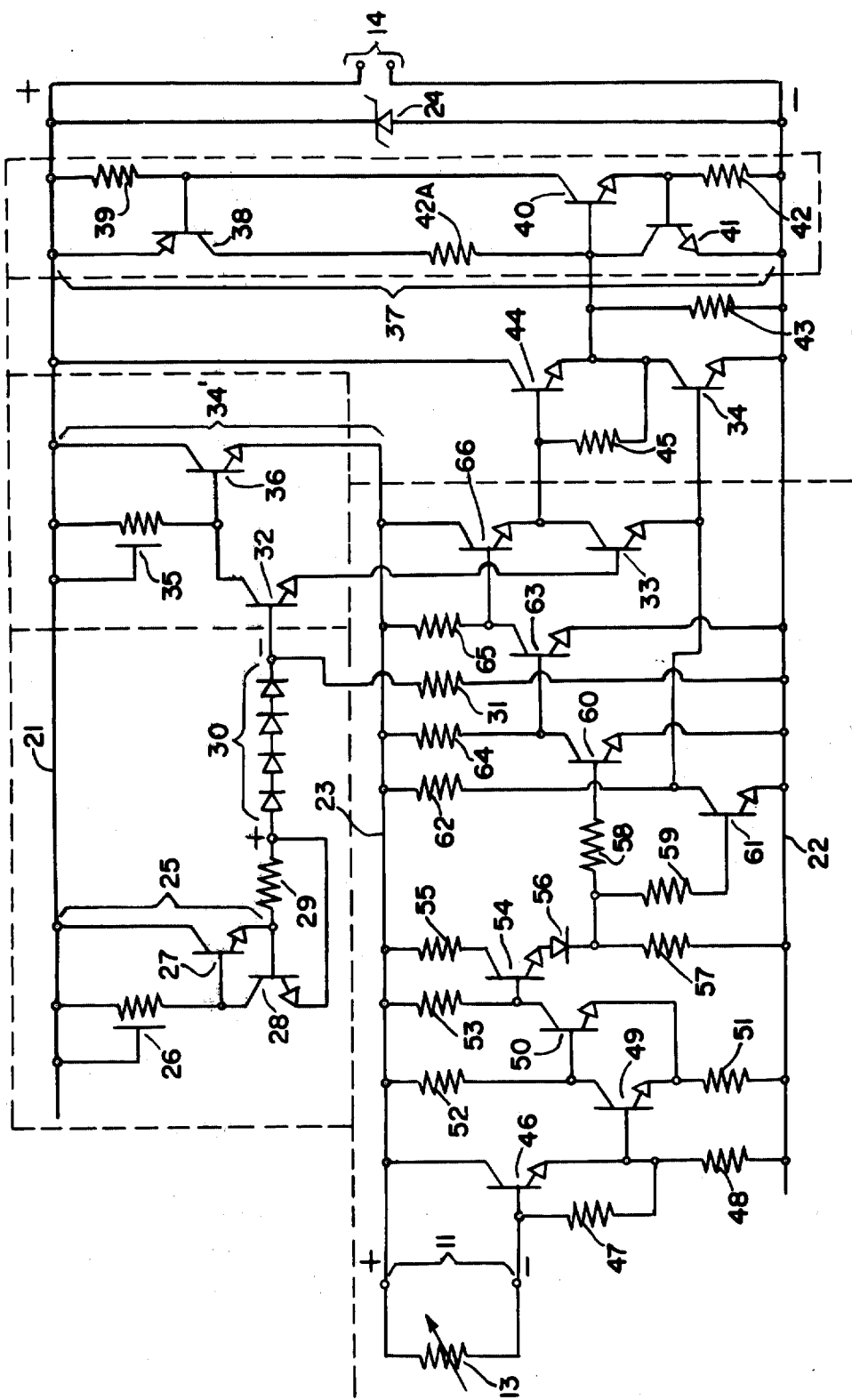
FIG. 3 illustrates diagrammatically the complete zero-voltage-switch trigger circuit of the invention with the input control for normally-open operation.

The embodiment of the ZVS trigger control circuit 10 is shown in diagrammatic form in FIG. 3, where like designations indicate the input control terminals 11 and the switching terminals 14. There are three voltage busses within the circuit, designated as the positive power terminal bus 21, the negative power terminal bus 22, and the internal controlled voltage bus 23, all other connections being circuit nodes. The ZVS trigger circuit of FIG. 3 is composed of several sections to be described separately. A zener diode 24 is connected across the power terminals 14 to protect the internal circuit from excessive overvoltage which could cause false triggering or reverse voltage which could damage the circuit components.

Figure 2:
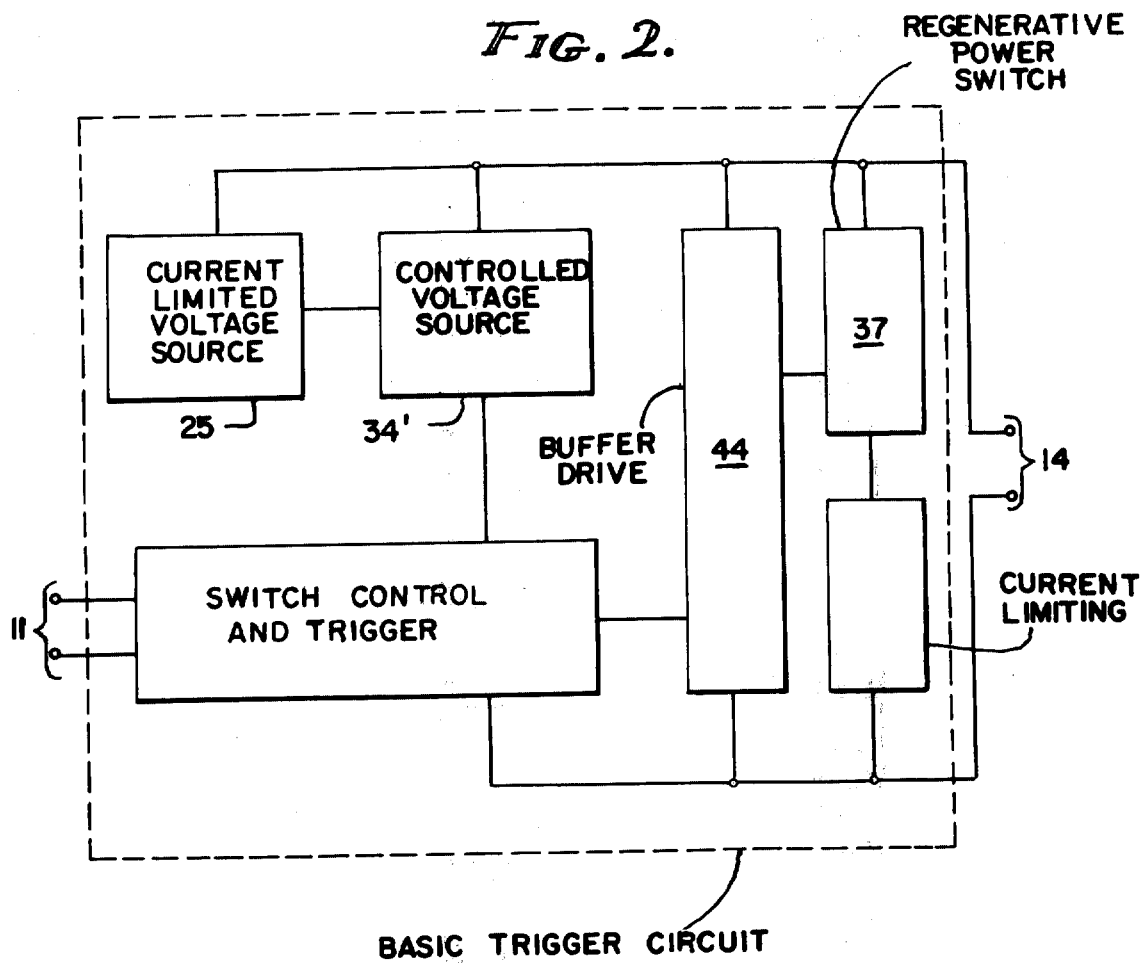
FIG. 2 illustrates in block diagram form the basic organization of the circuit comprising the invention.

Connected to the positive power terminal bus 21 is a current-limited voltage source generally designated at 25 in FIGS. 2 and 3 and comprised of a depletion mode MOSFET resistor 26, an amplifier transistor 27, a feedback transistor 28, and a current sensing feedback resistor 29. This current-limited voltage source is connected to the positive end of a series diode string 30, this diode string providing an offset voltage depending on the total number of diodes in the string. Four diodes are illustrated here to provide 4 × 0.6 volts or 2.4 volts, this offset voltage plus several other series offsets providing the upper limit of voltage on the power terminals 14 before trigger pulse inhibition occurs. The negative end of the diode string is connected through a resistor 31 to the negative power terminal bus 22 to conduct leakage currents and thus prevent those leakage currents from interfering with the other portions of the trigger circuit before the inhibition threshold voltage is reached. When inhibition threshold is reached, the current source 25 conducts through the diode string 30 and subsequently through the transistors 32, 33 and 34 to the negative power terminal bus 22. This current causes their respective collectors to go into a saturation condition and effectively clamps the collector nodes. The effect of this clamping will be described hereinafter.

Also connected to the positive terminal bus 21 is a controlled limited voltage source generally designated at 34', comprised of a second depletion mode MOSFET resistor 35, an amplifier transistor 36, and the control transistor 32. The emitter of the amplifier transistor 36 is connected to the internal voltage bus 23, and in fact delivers adequate current and voltage to this bus when the voltage across the switch terminals 14 is nominally between 0.5 and 4.0 volts. However when the inhibition threshold voltage is reached and exceeded the current from the current source 25 causes the control transistor 32 to conduct in saturation, causing the current from the MOSFET resistor 35 to be diverted away from the amplifier transistor 36, thus effectively shutting off the voltage on the internal bus 23 and disabling the switching and triggering circuit.

Also connected at one end to the positive terminal bus 21, and connected at the other end to the negative terminal bus 22, is the current limited power switching circuit generally designated at 37, and comprised of the latching transistor 38, the bypass resistor 39, the amplifier transistor 40, the shunting transistor 41, the feedback resistor 42 and the limiting resistor 42A. In an integrated form, the circuit combination of the transistors 38 and 40 could be defined as a 4-terminal SCR device. The operation of this circuit is such that a current introduced to the base of transistor 40 from the preceding circuit is amplified by transistor 40 and imposed on resistor 39 so as to cause transistor 38 to come into conduction to add to the base drive of transistor 40, to thus increase the input drive current to transistor 40 to an amount sufficiently large that the two transistors 38 and 40 (being connected in a regenerative feedback loop) switch suddenly into hard conduction. However, when the emitter current of transistor 40, flowing through feedback resistor 42, rises to a predetermined value, the excess current then diverts through the base of transistor 41 which then turns "ON" and in cooperation with resistor 42A shunts the regenerative base drive current away from transistor 40, effectively reducing the regenerative action of the circuit so as to limit and maintain a maximum current flow through the switching circuit as will be described hereinafter.

The transistor 41 could be replaced by a Darlington compound pair of transistors to effect more shunting action. In association with the transistor 40, a bypass resistor 43 is connected between the base of transistor 40 and the negative terminal bus 22. The function of this resistor 43, cooperatively working with resistor 39 is to control the sensitivity of the switching circuit and establish the threshold point for regenerative action.

A shunting transistor 34 is also connected in parallel to bypass resistor 43 between the base node of transistor 40 and the negative power terminal bus 22, and when in conduction this transistor 34 shunts all node currents to the negative power terminal bus and clamps the nodal voltage, thus preventing the regenerative circuit from spontaneously turning "ON" from the effects of thermal leakage currents or dV/dt induced node current.

Also, connected between the positive terminal bus 21 and the base node of transistor 40, is a buffer drive transistor 44 such that the base input current delivered to the buffer transistor 44 is amplified and delivered from the emitter of transistor 44 as from a low impedance to supply adequate drive to the base of transistor 40. A resistor 45 is connected between the base and emitter of transistor 44 to bypass thermal leakage currents and prevent accidental drive to the regenerative switching ciruit 37. A clamping transistor 33 is also connected to the base node of transistor 44, and when in conduction clamps the base node of transistor 44 to further reduce the possibility of thermal leakage current or dV/dt induced current being amplified and delivered to the switching circuit 37. The drive current for the transistors 33 and 34 is received from the trigger inhibit circuit composed of current source 25, diode string 30, and control transistor 32, as previously described.

The remaining circuitry in FIG. 3 is the trigger control system connected between the internal voltage bus 23 and the negative terminal 22, and between the input control terminals 11 and the buffer drive transistor 44. In this normally-open (N.O.) version of the control circuit the positive terminal of the control terminals 11 is connected directly to the internal voltage bus 23 and can be used as low voltage source for the control elements if required. The negative terminal of the control terminals 11 connects to the base of transistor 46 and to the resistor 47, the value of which sets the input sensitivity of the control circuit.

Connected to the emitter mode of transistor 46 is resistor 48 and the base of transistor 49, which is the first half of a Schmitt trigger. Resistor 48 and transistor 46 establish the bias of the base of transistor 49 to determine the condition of the Scmitt trigger as will be discussed hereinafter. The Schmitt trigger is composed of transistor 49, a second transistor 50, a common emitter resistor 51, a collector load resistor 52 also connected to the base of transistor 50, and a second collector load resistor 53 which is also connected to a buffer transistor 54. The buffer transistor 54 allows high resistances to be used in the Schmitt trigger circuit and still provide adequate current drive to the subsequent clamping circuits. A collector resistor 55 acts to limit the current drawn by buffer transistor 54, and a diode 56 provides a small offset threshold voltage before current is delivered to the clamping transistors. A bleeder resistor 57 keeps minor leakage currents from reaching the clamping transistors. Two current sharing resitors 58 and 59 are connected from the diode 56 to the base of clamping transistors 60 and 61. Normally these clamping transistors 60 and 61 are in the "OFF" condition. The collector node of transistor 61 is connected to the base of transistor 34, and resistor 62 supplies current from the internal voltage power bus 23 to the transistor 34 to effect clamping to the base node of transistor 40 when the circuit is in the non-triggered condition. The collector node of transistor 60 is connected to the base of clamping transistor 63, and resistor 64 supplies current from the internal voltage bus 23 to the transistor 63 to effect clamping of the base node of drive transistor 66 by shunting the current supplied through resistor 65 from the internal voltage bus 23.

Normally the following conditions exist in the circuit of FIG. 3: As the voltage on terminals 14 increases, the controlled voltage source 34' delivers current and voltage to the internal voltage bus 23. As the voltage on the internal voltage bus 23 increases, the clamping transistors 34 and 63 come into conduction and prevent the associated circuitry from turning on. If the input control terminal 11 has none or inadequate current supplied, the transistor 46 is OFF and the bias to the Schmitt trigger is low. The Schmitt trigger initially sets up the transistor 49 OFF and transistor 50 ON in saturation. The voltage at the collector node of transistor 50 is held low in saturation, and the offset voltage of the base-emitter junction of transistor 54, plus the offset of the diode 56, will keep the base node of transistors 60 and 61 below the conduction threshold point, allowing the current through resistors 62 and 64 to hold transistor 34 and 63 in saturation.

If, or when, the input control terminal 11 is receiving adequate current, the emitter node of transistor 46 raises the bias voltage on the base of the Schmitt trigger input transistor 49 and when this bias voltage exceeds the conduction threshold point of the input transistor, the Schmitt trigger suddenly and instantly switches condition. Input transistor 49 turns ON and output transistor 50 turns OFF. The collector node of transistor 50 increases in voltage and drives the base of transistor 54, which in turn drives current through diode 56, and resistors 58 and 59 to bring transistors 60 and 61 into hard saturation conduction. In saturation, the transistors 60 and 61 cause transistors 34 and 63 to turn OFF, allowing the current from resistor 65 to drive the base of transistor 66, which in turn drives transistor 44, which drives transistor 40 to effect switching of the regenerative switch circuit. However, if the Schmitt trigger has not changed condition before the upper threshold limit is reached, the voltage on the internal voltage power bus 23 is reduced as previously described and the control circuit is disabled regardless of the input control conditions.

Figure 4:
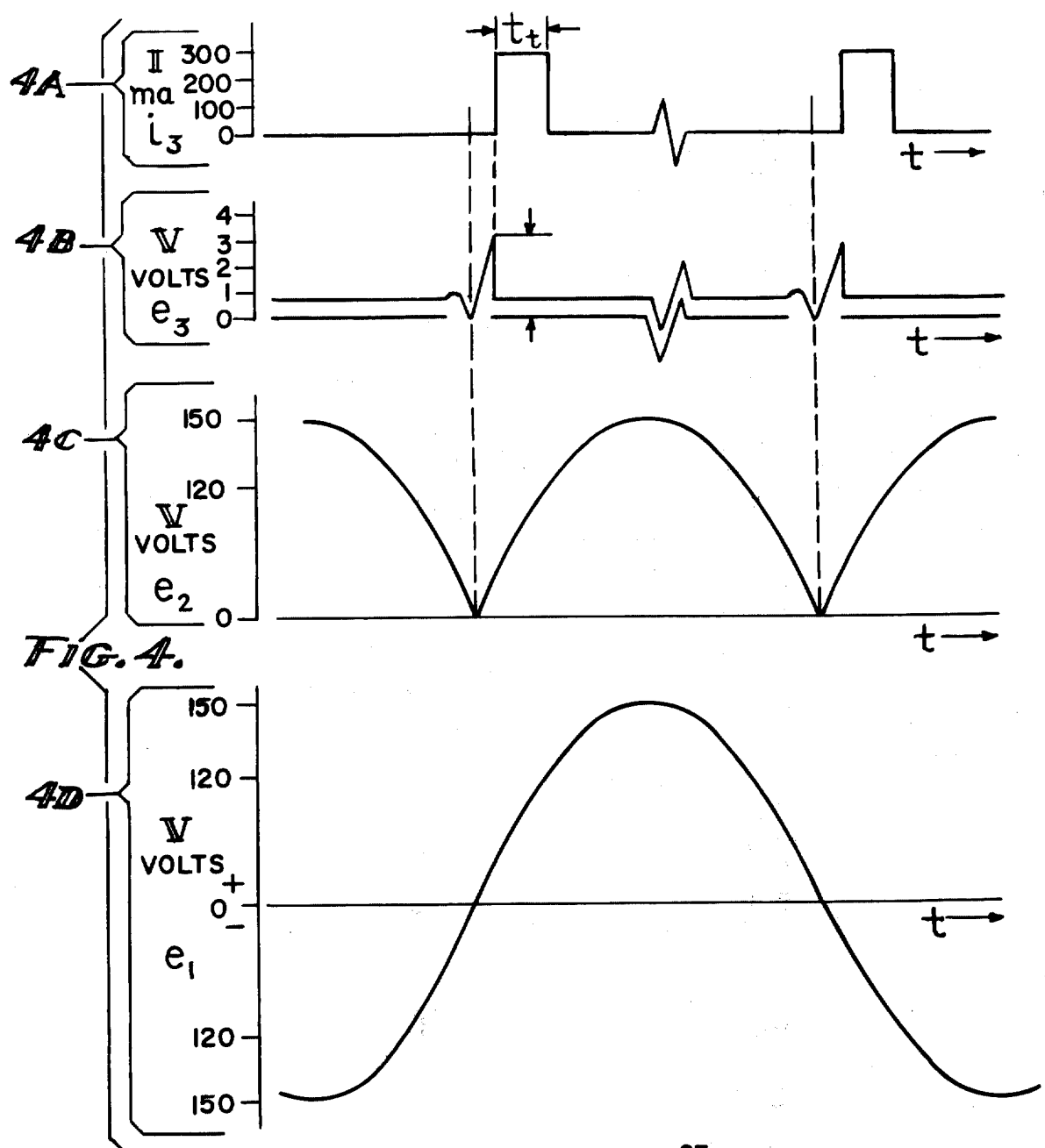
FIGS. 4 A through 4 D illustrate voltage wave form diagrams representing the various applied voltages and timing relationships of the circuit represented in FIG. 1.

To further explain the operation of the trigger circuit, reference is made to FIG. 4, which illustrates basic voltage and current wave forms at the power switching terminals of the circuit. In FIG. 4, the sine wave voltage wave form $e_1$ is the normal AC line voltage, for example only, in a 120 VRMS system. When the trigger circuit is not switching, this voltage $e_1$ is applied from the line, through the load resistor 18 (FIG. 1), directly across the triac switch 15, and is also subsequently applied to the diode bridge 16 through the bleeder resistor 17. The diode bridge is connected so as to commutate the voltage polarity of $e_1$ such as to maintain a positive potential on the "A" terminal of the bridge and a negative potential on the "B" terminal of the bridge. The bridge 16 also serves to steer current $i_3$ (FIG. 1) and to prevent reverse voltage from being applied to the trigger circuit 10.

As a consequence of the action of the diode bridge 16, the voltage applied to the power switch terminals 14 of the trigger circuit 10 is a full wave rectified sine wave as shown in $e_2$ of FIG. 4. However, when an adequate input current is provided at the input control terminals 11 of the trigger circuit, the switching circuit will switch each time the power switching terminal voltage $e_2$ rises to a nominal three volts as shown in $e_3$ of FIG. 4, and the definite and sudden voltage change applied to the gate 20 of the triac 15 will force a large current $i_3$ to the gate 20 to effect hard triggering of the triac, although the internal current limiting function of the trigger circuit will limit the maximum trigger current $i_3$ to a nominal 300 milliamperes. Note that in FIG. 4 the time base of $e_3$ and $i_3$ is interrupted and foreshortened to allow time expansion around the zero crossing point. The actual time duration $t_t$ of trigger current $i_3$ is nominally less than 10 microseconds, or just as long as required for the triac 15 to trigger and subsequently reduce its terminal voltage $e_1$ to nominally one volt until the line voltage cycles through zero again. The trigger circuit 10 must fire the triac 15 each one-half cycle depending on the input control terminal 11 conditions of the trigger circuit.

Figure 5:
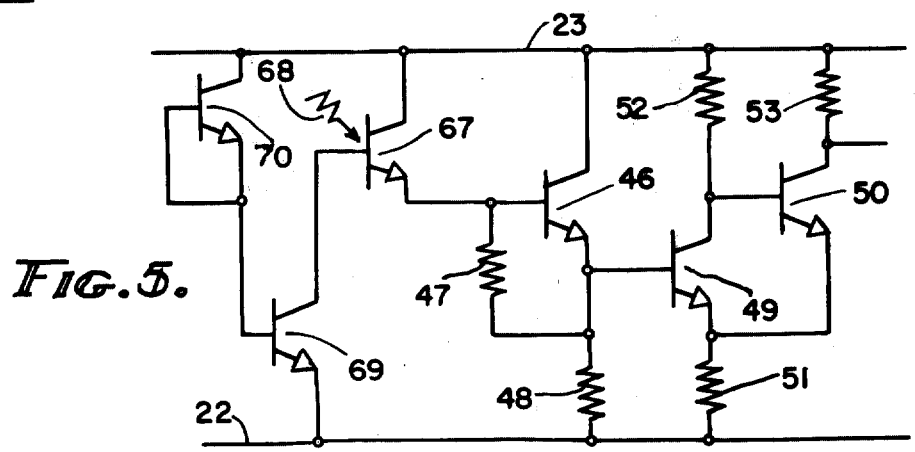
FIG. 5 is an alternate input control circuit for the trigger circuit of FIG. 3, showing additional circuitry for providing a photo-transistor input control having no external connections.

It is possible to provide an optically coupled input control to the switching circuit as shown in FIG. 5. In FIG. 5 like reference numbers are used as in FIG. 3, only a portion of which is represented here. Three additional components are shown as an internal connection to the biased transistor 46. The phototransistor 67, when illuminated by an incident photon flux 68, will conduct current between the internal voltage bus 23 and the base of the bias transistor 46 to effect adequate current drive to the input of the control circuit. Additional transistor gain stages may be included in this portion of the circuit and still be within the spirit and scope of the invention.

A bleeder transistor 69 is provided between the base node of the phototransistor 67 and the negative terminal bus 22 to conduct away thermal leakage current and thus stabilize the function of the phototransistor 67 for temperature variations. The bleeder transistor 69 receives a base drive current from a reverse diode or diode-connected transistor 70 which delivers a leakage current in proportion to temperature. Thus the input control circuit can be operated without any external connections.

Figure 8:
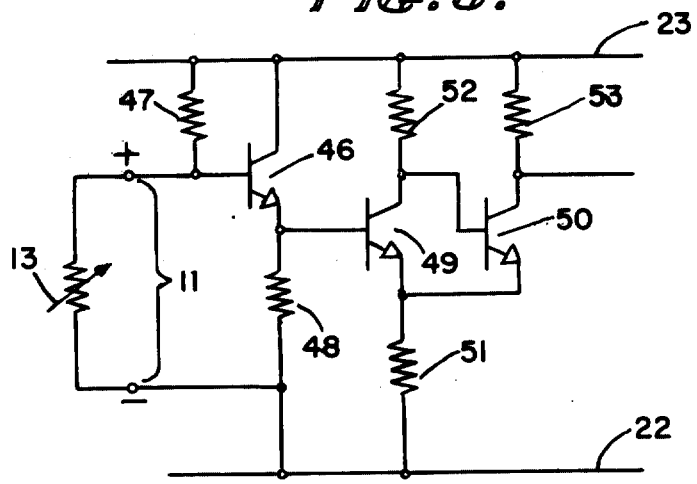
FIG. 8 shows an alternate input control circuit connection for FIG. 3 with the connection for normally-closed operation.

The previous circuits of FIGS. 3 and 5 have been described as being normally open (N.O.) functions, i.e., the circuit is open unless the input control is adequate to effect closing. The opposite function, normally closed (N.C.), can be obtained be simple changes of circuit connection as shown in FIG. 8. In FIG. 8, like reference numbers are used as in FIG. 3, only a portion of which is shown. The changes in circuit connection are that resistor 47 is now connected from the base of the biased transistor 46 to the internal voltage bus 23, and the input control terminals 11 are now connected between the base node of biased transistor 46 and the negative terminal bus 22. All other connections are the same. Also, the phototransistor connections of FIG. 5 can be adapted to this input connection.

Figure 6:
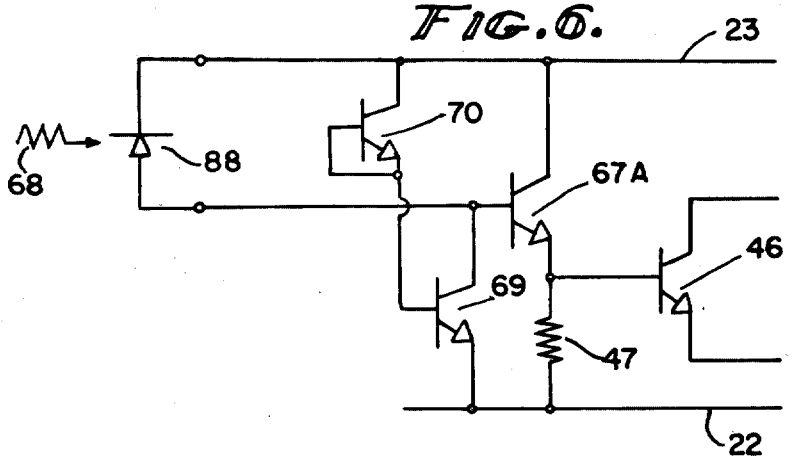
FIG. 6 is another alternate input control circuit using a photo-diode as input with separate thermal leakage compensation circuit.
Figure 7:
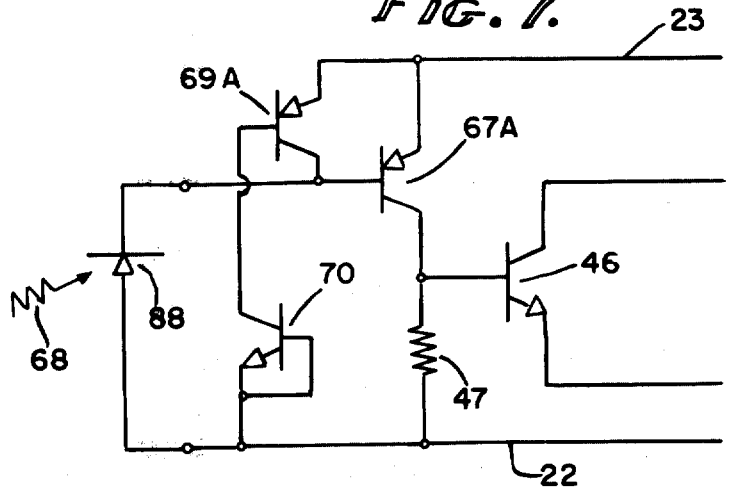
FIG. 7 is another alternate input control circuit equivalent to FIG. 6 but using PNP input transistors to permit the photo-diode to be connected to a power bus.

Alternatively, instead of employing an integrated photo-transistor 67 as in FIG. 5, the input to the switching control circuit may be obtained from a photo-diode 88 as illustrated in FIGS. 6 and 7. In each of these two figures a separate transistor 67A is used to amplify the photo-diode current and a signal voltage developed across the load resistor 47. The thermal leakage compensation circuit includes transistors 69 and 70, where transistor 70 is used as a diode to develop a proportional collector-base thermal leakage current. In FIG. 7 the photo-diode 88 is connected to the common power bus 22 and PNP input transistors are used. The output transistor 46 represents the input to the control circuit.

Figure 9:
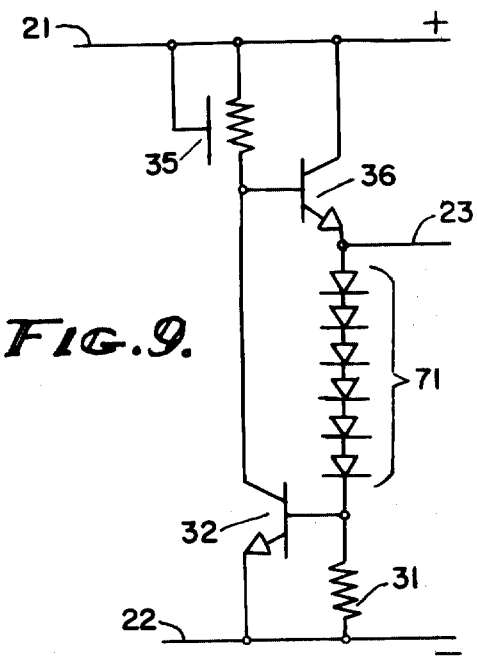
FIG. 9 is an alternate arrangement of the basic controlled voltage source circuit of FIG. 3 modified to allow triggering at any point in the line voltage cycle but retaining all other desirable features of the basic circuit.

The circuit of FIG. 3 can be further modified to eliminate the zero voltage switching (ZVS) function and perform as a phase-controlled trigger circuit while retaining the other basic and desirable features of hard firing, current limiting, and thermal stability. The modification is accomplished by eliminating the voltage sensing circuit comprised of the current limited source 25 and diode string 30 in FIG. 3, and re-arranging the connection to the controlled voltage source 34' by the circuit shown in FIG. 9, where like reference numbers are used as on FIG. 3, only a portion of which is shown. A new diode string 71 is connected from the internal voltage bus 23 to the base node of the control transistor 32, while the emitter of the control transistor 32 is connected to the negative terminal bus 22 as is also the bleeder resistor 31. With the input power circuit connection as in FIG. 9 the voltage on the positive terminal bus 21 increases until such voltage reaches the value of the total junction offset voltage of the series string of diodes 71 plus the base-emitter drop of the control transistor 32, at which time the current through the current-limited resistor 35 will be shunted through the control transistor 32 away from the base of the amplifier transistor 36 thus stabilizing and holding the voltage on the internal voltage bus while the voltage on the positive terminal bus 21 continues to increase to peak line voltage. The switch control circuits can be triggered instantly at any time throughout the line voltage cycle by a sudden input current at the input control terminals 11. Such phase-controlled triggering is useful in variable power, speed and voltage systems.

Figure 10A:
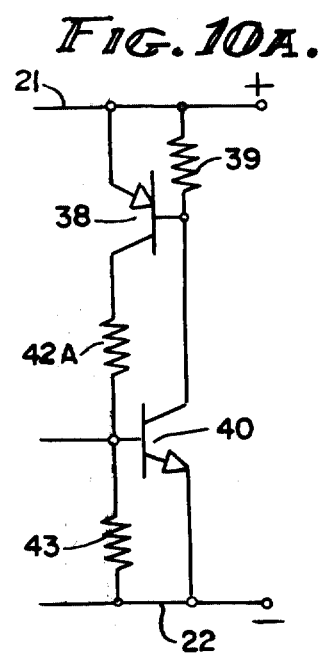
FIGS. 10A, 10B and 10C show alternate schematic representations of the regenerative SCR type device or circuit used as the power switching device with the attendant junction shunting resistors.
Figure 10B:
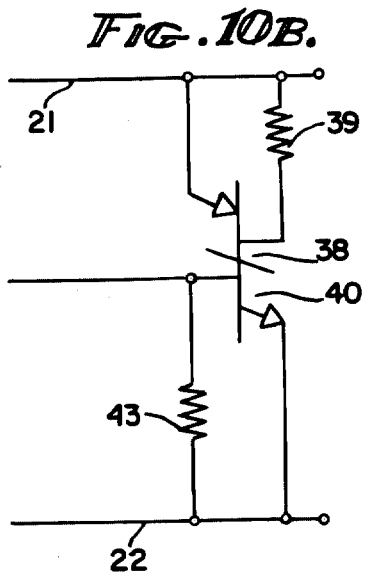
Figure 10C:
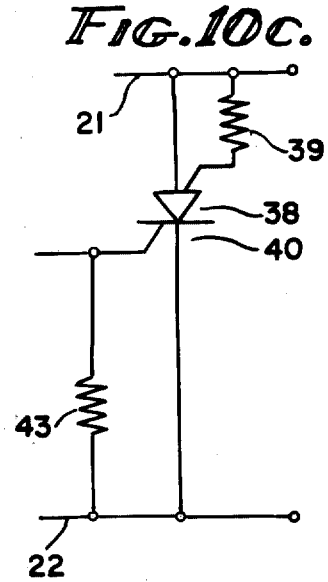

To avoid possible conflicts of notation, FIGS. 10 A, 10 B and 10 C illustrate alternate representations of the regenerative switching circuit and the integrated schematic SCR-type symbols which are also included within the scope of the invention. The sensitivity controlling resistors relative to this device are also included in these circuits.

Figure 11:
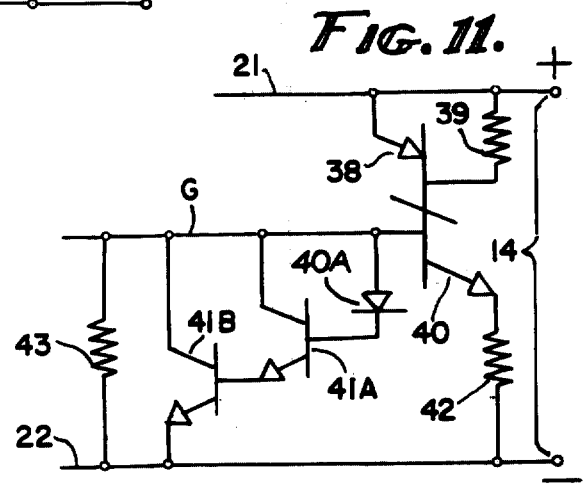
FIG. 11 shows an alternate connection wherein a Darlington connection of two transistors and a diode are used to obtain the shunting action.

In FIG. 11 a current limiting circuit is shown having an integrated 4-terminal SCR type device employed to replace the two transistors 38 and 40, those portions of the integrated symbol being so indicated. However, with the integrated SCR device, a better current shunt is required to effectively inhibit the turn-on regeneration, and in this FIG. 11 the Darlington compound connections of transistors 41A and 41B and gating diode 40A are employed to obtain a high current capability. The action of the circuit is to effect a maximum limited value to the peak pulse current as described previously, except that the limiting drive is obtained from the gate node.

Figure 12A:
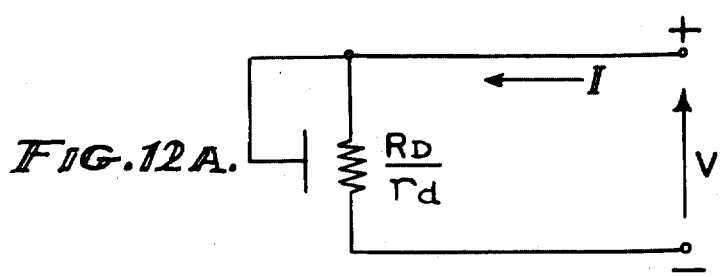
FIG. 12 illustrates the basic action of a current limiting resistor and the basic I–V performance of the resistor composed of a depletion mode MOSFET or JFET device.
Figure 12B:
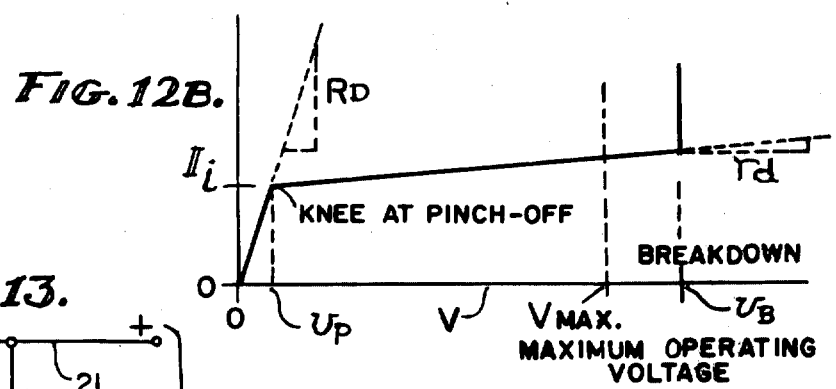

The basic operation of a current-limited resistor is illustrated in FIG. 12 where the I-V characteristic of a depletion mode MOSFET or JFET device is shown. The general circuit representation is shown in FIG. 12 A, while the graph of the conduction characteristic is shown in FIG. 12 B. The important characteristic of the current-limiting resistor is that it provides a low value of resistance $R_D$, at low voltages, but when a certain "pinch off" voltage is developed across the terminals of the device the resistance increases rapidly so as to effect a dynamic resistance $r_d$, and hold the current nearly constant as the terminal voltage increases. It is the use of the low value of $R_D$ at low voltages to power the switching circuit prior to the inhibit threshold point, and the use of the dynamic resistance $r_d$ to limit current at high terminal voltages after exceeding the inhibit threshold point that constitutes a basic contribution to the art of powering this switching circuit and any similar circuit so related. Some anticipated alternate uses of this device in related circuits will be presented.

Figure 13:
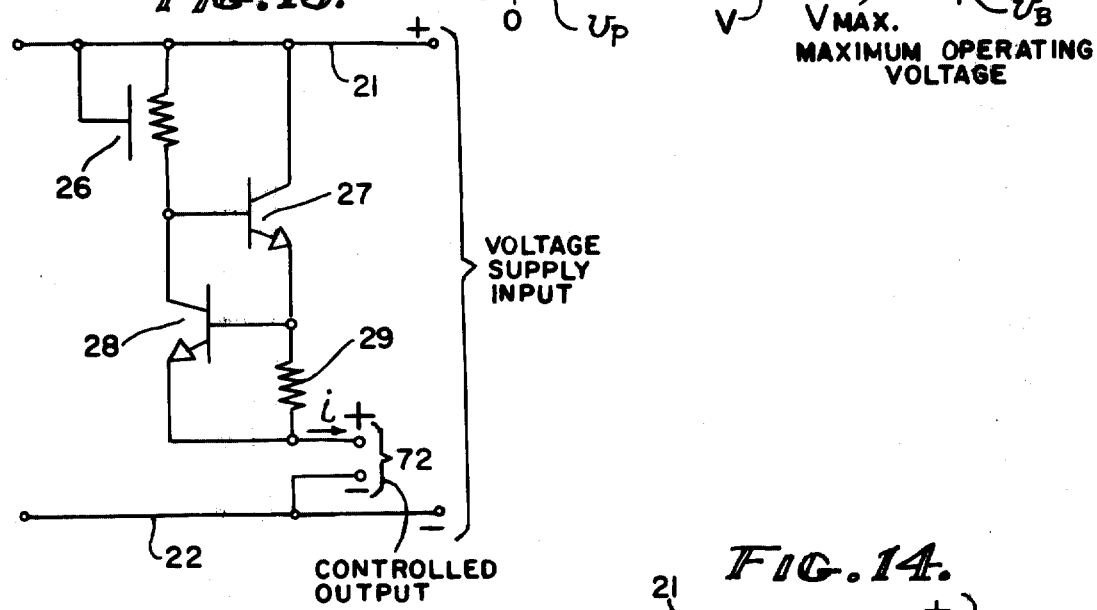
FIG. 13 shows the basic means of using a current limiting resistor with auxiliary transistors to obtain a current-limited voltage source.

FIG. 13 illustrates the basic feedback circuit used with the current-limiting resistor to provide a current-limited voltage source where the maximum limited current is greater than the pinch-off current of the current limited-resistor. This circuit is employed in FIG. 3 as the current-limited voltage source 25 and like reference numbers are used in describing its function. In FIG. 13 the current-limited resistor 26 conducts current to the base of the amplifier transistor 27 to provide a low impedance current/voltage source at the emitter node of transistor 27 having a current capability greater than the limited current of the current-limited resistor 26. The current $i$ being drawn through the controlled output terminal 72 must conduct through the feedback resistor 29, developing a bias voltage between the emitter-base junction of transistor 28. When the amplitude of the current $i$ through resistor 29 is sufficient, the base-emitter junction of transistor 28 begins to conduct and a collector-emitter current is conducted through transistor 28 effectively by-passing the base-emitter junction of transistor 27, and shunting the current through the current limited resistor 26 away from the base of transistor 27 to the degree that an equilibrium is established and a nominally constant current is then supplied at the controlled output terminals 72. This circuit and function is another basic feature of this invention.

Figure 14:
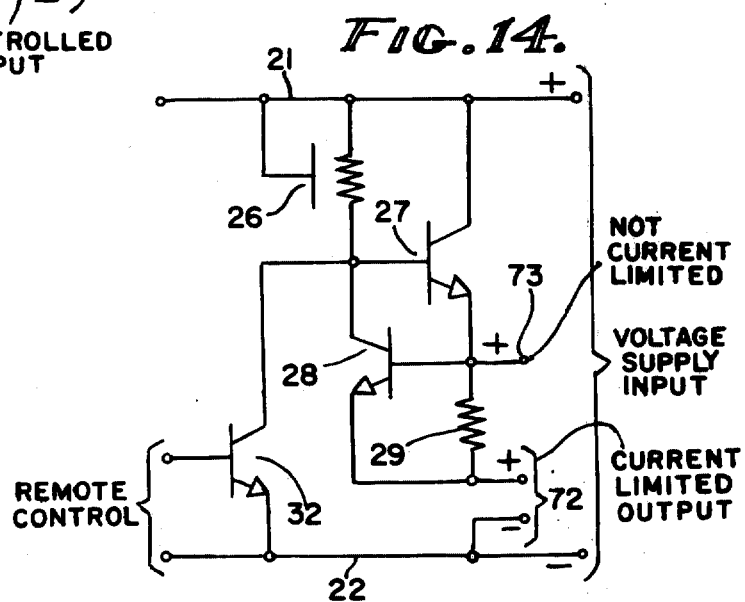
FIG. 14 shows an alternate version of the voltage source of FIG. 13 having a means of obtaining a remotely shutoff current limited voltage source.

In FIG. 14, the same circuit and function is shown as in FIG. 13, where again like reference numbers are used for comparison, but in FIG. 14, a remote voltage control is provided by a shunting transistor 32 to effect reduction or turn-off of the voltage at the output terminals 72. The transistor 32 serves the same function as transistor 32 in FIG. 3 where the voltage source 34' is equivalent to the circuit of FIG. 14 using the unlimited current/voltage terminal 73 and disregarding the resistor 29 and transistor 28. When transistor 32 is conducting due to a current drive to the base node, the collector current drains current away from the base-emitter junction of transistor 27, causing the voltage supplied to the emitter node of transistor 27 to be reduced, and if transistor 32 conducts heavily enough into saturation, the voltage on the emitter node of transistor 27 can be reduced to zero. This circuit and function is a basic element of the control means of this invention.

These embodiments of the use of current-limited voltage sources, current diverting switching circuits and suppressed gate functions to produce stable hard-firing trigger circuits are but examples of the several means available to those skilled in the art of electronic circuits once these methods have been disclosed, and such combinations of these elements will fall within the true spirit and scope of this invention.

Listed below in relation to the reference numbers by which they are designated are the component values for the various components used in the circuits described above.

| Reference Numbers | Nominal Value |
|---|---|
| 13 | 1 KΩ min., 1MΩ Max. |
| 15 | Triac 10A-120VRMS |
| 16 | P-N Diodes 100mA 300VPIV |
| 17 | 100 Ω |
| 24 | Zener diode, 500mA, 300VZ |
| 26 & 35 | $R_p$ = 30 KΩ to cutoff at 10V, 30 μA |
| 27, 36, 40, 44 | (HV)NPN, $BV_{CEO}$ = 300V |
| 28 | (LV)NPN, $BV_{CEO}$ = 10V |
| 29 | 5 KΩ |
| 30, 56 | PN Diode - 1mA |
| 31 | 60 KΩ |
| 32, 33, 34, 41, 46, 49, 50, 54, 60, 61, 63, 66, 69, 70 | (LV) NPN |
| 38 | (HV) PNP |
| 39, 55, 51 | 5 KΩ |
| 42 | 10 Ω |
| 43, 45, 47, 48 | 10 KΩ |
| 42A | 100 Ω |
| 52, 62, 64, 65 | 20 KΩ |
| 53 | 30 KΩ |
| 57 | 60 KΩ |
| 58, 59 | 1 KΩ |
| 67, 12 | photo NPN |

Having thus described the invention, what is claimed to be novel and desired to be covered by United States Letters Patent is as follows:

1. A control circuit for effecting an instantaneous voltage and current drive to an electrical power switching device to cause said power switching device to suddenly turn ON and latch in a conductive state, said control circuit comprising:
   a. a pair of external terminal busses of opposite polarity, one positive and one negative;
   b. an internal controlled power bus of polarity positive relative to said negative terminal bus;
   c. a current-limited voltage source connected at one end to said positive one of said pair of terminal busses;
   d. a voltage-limited voltage source connected at one end to said positive one of said pair of terminal busses and at the other end connected to said internal controlled power bus;

e. a low-voltage switching control circuit connected between said internal controlled power bus and the negative polarity bus of said pair of terminal busses;

f. a high voltage switching power driver including a high voltage current booster connected between said pair of terminal busses;

g. means operatively associated with said low voltage switching control circuit operable to cause said low voltage switching control circuit to function as an input control sensor and to produce a sudden high speed transient drive to said high voltage power driver;

h. a high voltage regenerative feedback power switching circuit connected between said pair of terminal busses;

i. means operable to provide functional stability to said low voltage switching control circuit and said regenerative feedback power switching circuit, and including means for clamping said terminal bus voltages at predetermined values and for shunting unwanted thermal leakage currents to non-sensitive portions of the circuit;

j. means operable to convert said regenerative feedback power switch to a high-voltage latching current-limited switch to produce sudden current pulses; and k. a degenerative feedback circuit connected between said regenerative feedback power switching circuit and one of said terminal busses and operable to counter the regenerative effect and limit the maximum amplitude of said current pulses to a predetermined value.

2. The combination according to claim 1, in which said current-limited voltage source is connected to said voltage-limited voltage source to provide a threshold voltage sensor operable to effect a low-voltage-point turn off of the voltage being supplied through said voltage-limited voltage source to produce a zero-voltage-switching action by said circuit.

3. The combination according to claim 1, in which said voltage-limited voltage source is connected to said low-voltage switching control circuit.

4. The combination according to claim 1, in which said low-voltage switching control circuit is connected to said high voltage power driver to clamp the input to said high voltage power driver to prevent unintentional output from said high voltage power driver.

5. The combination according to claim 1, in which said high voltage power driver includes a high voltage current booster connected to said high voltage regenerative power switch and constituting a high current input drive thereto to effect latching turn-on of said regenerative power switch.

6. The combination according to claim 1, in which said degenerative feedback circuit is connected in series with said regenerative power switch to reduce the regenerative action of said regenerative power switch to control the maximum amplitude of pulse current through said regenerative power switch.

7. The combination according to claim 1, in which said current-limited voltage source and said low-voltage switching control circuit are connected to said high voltage power driver and said regenerative power switch to prevent unintentional turn-on of said regenerative power switch.

8. The combination according to claim 1, in which said current-limited voltage source constitutes a voltage-limit threshold sensor and includes a non-linear resistor, first and second transistors each having base, collector and emitter terminals and a second resistor, said non-linear resistor being connected in parallel with the collector junction between the collector and base terminals of said first transistor, the emitter of said first transistor being connected to the base terminal of said second transistor, the collector terminal of said second transistor connected to the base terminal of said first transistor in feedback arrangement, said second resistor being connected in parallel with the emitter junction between the base and emitter terminals of said second transistor, and output means connected to the emitter terminal of said second transistor so that a current through the circuit from the collector of said first transistor to the emitter of said second transistor will be limited by a degenerative feedback action.

9. The combination according to claim 1, in which said current-limited voltage source comprises a depletion mode MOSFET resistor connected to said positive terminal bus, a current amplifier transistor connected to said positive terminal bus, a feedback transistor connected to said MOSFET resistor and said current amplifier transistor, and a current sensing feedback resistor connected to said current amplifier transistor and said feedback transistor.

10. The combination according to claim 1, in which said current-limited voltage source is connected to the positive end of a series diode string to provide an offset voltage proportional to the number of diodes in the string.

11. The combination according to claim 1, in which said voltage-limited voltage source comprises a depletion mode MOSFET resistor connected to said positive terminal bus, an amplifier transistor connected to said positive terminal bus and said internal controlled power bus, and a control transistor connected to said negative terminal bus.

12. The combination according to claim 1, in which said high voltage regenerative power switching circuit comprises a feedback latching transistor, a bypass resistor, an amplifier transistor, a shunting transistor, a feedback resistor, and a current sensing resistor, said feedback latching transistor being connected to said positive terminal bus, said bypass resistor, said amplifier transistor and said feedback resistor, while said bypass resistor is connected to said positive terminal bus, and said amplifier transistor is connected to said feedback resistor, said shunting transistor and said current sensing resistor, and said current sensing resistor and said shunting transistor are connected to said negative terminal bus.

13. The combination according to claim 1, in which said high voltage regenerative power switching circuit includes an amplifier transistor, a bypass resistor connected between the base of said transistor and the negative bus of said pair of busses, said bypass resistor cooperatively associated with another bypass resistor to control the sensitivity of the switching circuit and establish the threshold point for regenerative action.

14. The combination according to claim 1, in which a trigger control circuit is connected between said internal bus of positive polarity and the negative bus of said pair of busses, said trigger control circuit including a pair of input control terminals of opposite polarity and a buffer drive transistor, the positive terminal of said input control terminals being connected directly to said internal voltage bus, a transistor, a resistor, the value of which sets the input sensitivity of the trigger control circuit, the negative terminal of said input control terminals connecting to the base of said transistor and to said resistor, and a Schmitt trigger including a transistor, a second transistor, a common emitter resistor, a collector load resistor connected to the base of said second transistor, and a second collector load resistor connected to said buffer transistor.

15. The combination according to claim 10, in which the negative end of said diode string is connected to the other bus of said pair of busses, and a resistor is interposed between said diode string and said bus and operative to conduct leakage currents to prevent such leakage currents from interfering with other portions of the trigger circuit.

16. The combination according to claim 11, in which the emitter of said amplifier transistor is connected to said internal bus of positive polarity.

17. The combination according to claim 13, in which a shunting transistor is connected in parallel to said bypass resistor between the base node of said amplifier transistor and the negative power terminal bus of said pair of busses, said shunting transistor when in conduction shunting all node currents to the negative power terminal bus and clamping the nodal voltage to prevent the regenerative circuit from spontaneously turning ON from the effects of thermal leakage currents or dV/dt induced node current.

18. The combination according to claim 13, in which a buffer drive transistor is connected between the positive bus of said pair of busses and the base node of said amplifier transistor, a resistor connected between the base and emitter of said buffer drive transistor to bypass thermal leakage currents to prevent accidental drive to the regenerative switching circuit, and a clamping transistor connected to the base node of said buffer drive transistor and when in conduction clamping the base node of the buffer drive transistor to further reduce the possibility of thermal leakage current or dV/dt induced current being amplified and delivered to said switching circuit.

19. The combination according to claim 14, in which said trigger control system includes a resistor connected to the collector of the buffer transistor to limit the current drawn thereby, a pair of clamping transistors normally in an OFF condition, a diode connected to the emitter of the buffer transistor to provide an offset threshold voltage before current is delivered to the clamping transistors, a bleeder resistor operative to keep minor leakage currents from reaching the clamping transistors, and a pair of current sharing resistors connected from one diode to the base of the clamping transistors.

20. The combination according to claim 14, in which said trigger control system includes a phototransistor operative to conduct current between the internal bus and the base of a bias transistor to effect adequate current drive to the input of the control circuit.

21. The combination according to claim 14, in which a bleeder transistor is provided connected between the base node of the phototransistor and the negative terminal bus.

22. The combination according to claim 1, in which said input control sensor circuit includes negative and positive input control terminals, a resistor connected between the positive input terminal and said internal voltage bus, and a transistor having its base node connected to said positive input terminal and its emitter connected to the input node of the Schmitt trigger and through a resistor to the negative input terminal and the negative bus of said pair of busses.

23. The combination according to claim 1, in which said current-limited voltage source includes a current-limited resistor, an amplifier transistor, said current-limited resistor being arranged to conduct current to the base of the amplifier transistor to provide a low impedance current/voltage source at the emitter node of said amplifier transistor having a current capability greater than the limited current of the current-limited resistor, a second transistor, a feedback resistor, and a pair of controlled output terminals of opposite polarity, the positive terminal of the pair being connected directly to the emitter of said second transistor and being connected through said feedback resistor to the emitter of said amplifier transistor whereby when the amplitude of the current through the feedback resistor is sufficient the base-emitter junction of the second transistor begins to conduct and a collector-emitter current is conducted through the second transistor bypassing the base-emitter junction of the amplifier transistor and shunting the current through the current limited resistor away from the base of the amplifier transistor to the degree that an equilibrium is established and a nominally constant current is then supplied at the controlled output terminals.

24. The combination according to claim 23, in which a shunting transistor is provided to effect reduction or turnoff of the voltage at the output terminals, said shunting transistor having its emitter connected to the negative bus of said pair of busses and its collector connected to the base of said amplifier transistor.

25. A phase-controlled trigger circuit, comprising:
  a. a pair of external busses of opposite polarity;
  b. an internal bus of positive polarity;
  c. a voltage-limited voltage source connected to one of said pair of external busses, said voltage-limited voltage source including a control transistor the emitter of which is connected to the negative external bus;
  d. a diode string connected between the internal bus of positive polarity and the base node of said control transistor
  e. a low-voltage switching control circuit connected between said voltage-limited voltage source and the other bus of said pair of external busses;
  f. a high voltage power driver including a high voltage current booster connected between said pair of external busses;
  g. means operatively associated with said low voltage switching control circuit operable to cause said low voltage switching control circuit to function as an input control sensor and high speed trigger drive for said high voltage power driver;
  h. a high voltage regenerative power switching circuit connected between said pair of external busses;
  i. means operable to provide functional stability to said low voltage switching control circuit and including means for clamping voltages at predetermined values and for shunting unwanted thermal leakage currents;
  j. means operable to convert said regenerative feedback power switch to a high voltage latching current-limited switch to produce sudden current pulses; and
  k. a degenerative feedback circuit connected between said regenerative feedback power switching circuit and one of said busses and operable to counter the regenerative effect and limit the maximum amplitude of said current pulses to a predetermined value.

* * * * *